(12) United States Patent
Zimmermann

(10) Patent No.: US 6,429,494 B1
(45) Date of Patent: Aug. 6, 2002

(54) SEMICONDUCTOR READ-ONLY MEMORY AND METHOD OF MANUFACTURING THE SAME

(75) Inventor: Ulrich Zimmermann, Mechanicsville, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/282,100

(22) Filed: Mar. 30, 1999

Related U.S. Application Data

(63) Continuation of application No. PCT/DE97/01897, filed on Aug. 29, 1997.

(30) Foreign Application Priority Data

Sep. 30, 1996 (DE) .......................................... 196 40 235

(51) Int. Cl.$^7$ .......................... H01L 29/76; H01L 29/94; H01L 31/062; H01L 31/113; H01L 31/119
(52) U.S. Cl. .......................... 257/391; 257/390; 257/32; 257/9
(58) Field of Search ................................ 257/390, 391, 257/909

(56) References Cited

U.S. PATENT DOCUMENTS

| | | | |
|---|---|---|---|
| 4,756,793 A | | 7/1988 | Peek |
| 5,300,804 A | * | 4/1994 | Arai ............................. 257/332 |
| 5,705,415 A | * | 1/1998 | Orlowski et al. ............ 438/259 |
| 5,920,099 A | | 7/1999 | Krautschneider et al. |
| 5,920,778 A | | 7/1999 | Rösner et al. |
| 6,191,459 B1 | * | 2/2001 | Hofmann et al. ............ 257/390 |

FOREIGN PATENT DOCUMENTS

| | | |
|---|---|---|
| DE | 42 14 923 A1 | 12/1992 |
| EP | 0 399 191 A1 | 11/1990 |

* cited by examiner

*Primary Examiner*—Tom Thomas
*Assistant Examiner*—Thien F Tran
(74) *Attorney, Agent, or Firm*—Laurence A. Greenberg; Werner H. Stemer; Ralph E. Locher

(57) ABSTRACT

A semiconductor read-only memory (ROM) has trenches and vertical transistors. The trenches are filled with insulator material during the manufacturing process. Holes, which are as wide as the trenches are etched into the insulator at regions where word lines and decoder lines are to be provided over the trenches in a later manufacturing step. In a subsequent masking process for changing the conductivity characteristic of channel regions of transistors, channel regions selected according to programming requirements, are doped. The insulator remaining in the trenches prevents that regions under the insulator material are affected by the masking method.

6 Claims, 2 Drawing Sheets

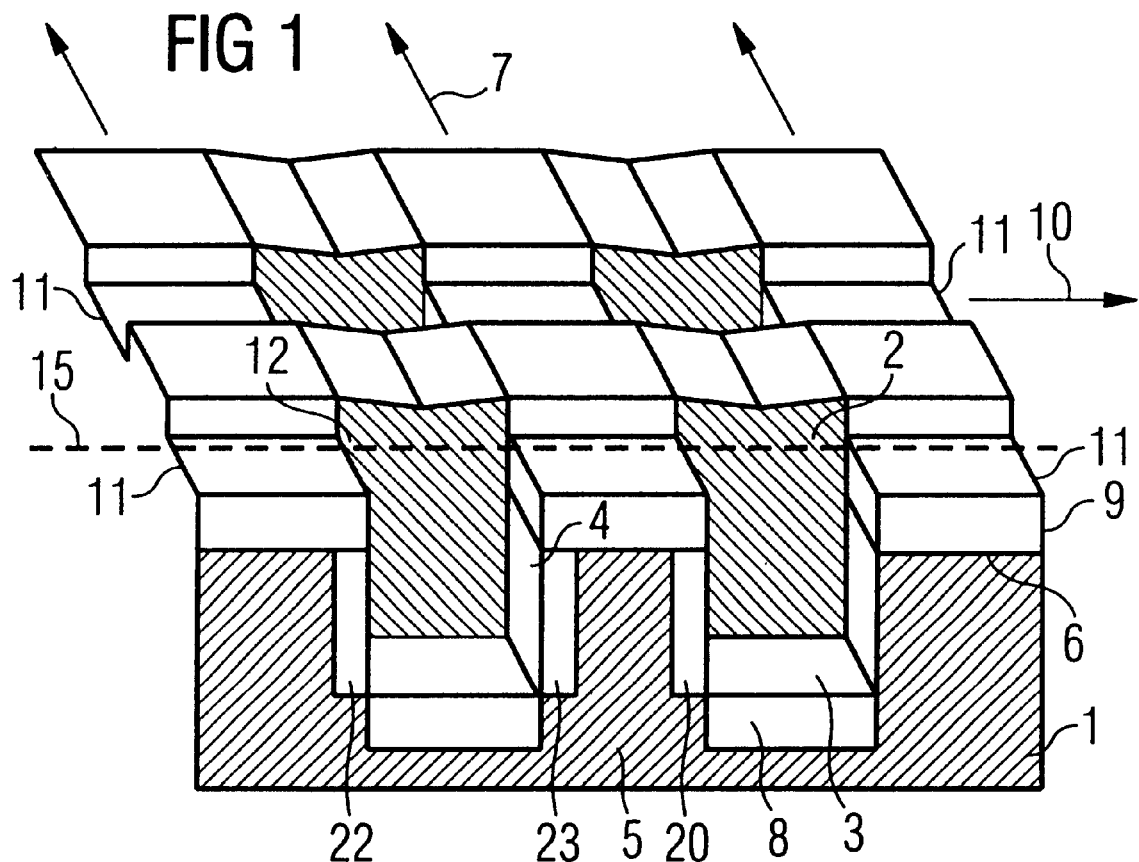
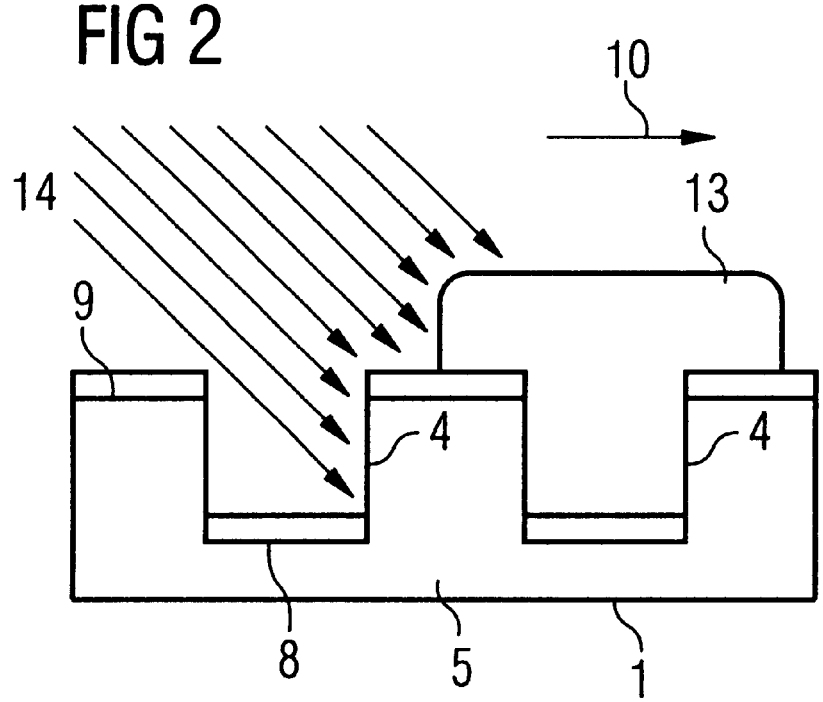

SEMICONDUCTOR READ-ONLY MEMORY AND METHOD OF MANUFACTURING THE SAME

ROSS-REFERENCE TO RELATED APPLICATION

This application is a continuation of copending International Application No. PCT/DE97/01897, filed Aug. 29, 1997, which designated the United States.

BACKGROUND OF THE INVENTION

Field of the Invention

The invention relates to a semiconductor read-only memory (ROM) with parallel trenches, with bit lines running along the trench bases and on the trench crowns in a longitudinal direction of the trenches, and word lines running transversely thereto and transistors formed vertically in the trench side-walls. The invention further relates to a method for manufacturing such a semiconductor read-only memory. In such a semiconductor read-only memory, a programming is carried out by a suitable manipulation of the memory transistors during the manufacturing process.

Such ROMs usually have a plurality of parallel bit lines and a plurality of parallel word lines. The bit lines run via the source and drain terminals of the memory transistors.

The word lines run perpendicularly to the bit lines and connect the gate terminals of respective rows of memory transistors to one another. There are natural limits on the miniaturization of such a configuration. The gate of each transistor must have a specific minimum length to ensure that the flow of current between the source and the drain is reliably pinched off when the memory transistor is switched to the blocked state. The minimum distance between gate electrodes is furthermore determined by the manufacturing process.

Various modifications of customary ROMS have been proposed in order to achieve an increased packing density.

German Published, Non-Prosecuted Patent Application DE 42 14 923 A1 discloses a mask ROM device having a NAND structure and a method for manufacturing such a device. A plurality of trenches, which extend parallel to one another, are formed in a memory transistor area on the surface of a silicon substrate. MOS memory transistors use the trench side-walls as channel regions. For this purpose, a thin gate oxide is applied to the side walls and a gate electrode is in turn applied thereon. The bit lines run perpendicularly to the direction of the trenches, on the crowns and on the base alternately. The word lines are provided at a right angle thereto.

The ROM is programmed by doping the channel of selected memory transistors using a suitably masked implantation. As a result, by appropriately selecting the doping materials and their concentration the turn-on voltage of these memory transistors can be increased to a value which is above the operating voltage. Doped memory transistors thus block when the operating voltage is applied during the reading process of the ROM, while non-doped transistors switch through when the operating voltage is applied.

An alternative programming process consists of filling the trenches with an insulator and etching a hole into the insulator at those points on the trench side-wall at which a transistor, which switches through, is to be produced. Then, in a further manufacturing step, a gate oxide is formed on the wall of the hole. Polysilicon is then applied to the gate oxide in order to form the gate electrode. The regions of the trench side-walls in which a gate has not been formed form the cells which block when the operating voltage is applied.

Although the two programming methods described provide usable results, they have a number of specific problems.

In the programming method known from German Published, Non-Prosecuted Patent Application DE 42 14 923 A1, the implantation of the doping, and thus the adjustment of the turn-on voltage takes place with an oblique angle of incidence with respect to the trench side-walls. This oblique doping is also significant for the instant invention. The masking, which is used for the selective implantation is manufactured through the use of photographic patterning and is removed again after the implantation process. It is therefore then no longer possible to discern the position of the implantation. As a result, it is also no longer possible to align the gate oxide and gate electrode layers, which then have to be applied in the following manufacturing steps, directly with the position of the implantations. Accordingly, there is the risk of misalignment, so that the gates are not precisely formed over the implanted regions of the channels. As a result, it is possible for part of the channel of a memory transistor, which should normally be blocked even when the operating voltage is applied, to have sufficiently good conductivity. Undesired leakage currents, which increase the power requirement of the ROM, or even falsify the programming, will then flow. Furthermore, it is not readily possible to integrate this form of programming with a memory manufactured by the use of shallow-trench isolation (STI). The trenches have to be produced in a separate lithography and etching step after the STI process is finished. The gate polysilicon then runs over the topography, making lithography and patterning of the gate level more difficult.

The second-mentioned programming method also has a number of problems. Programming is carried out through the use of a photolithographically patterned resist mask which leaves those regions open at which a hole is to be etched into the insulator. Here too, problems arise as a result of the alignment of the programming mask, which cannot always be maintained precisely. If the trenches have the minimum phototechnically achievable width F, the misalignments of the programming mask in the direction of the word lines leads to a situation in which the overlapping between the trench and opening becomes smaller than the actual cross-section of the hole and in particular may become significantly smaller than F/2. However, on the other hand, holes with the full width ($\geq$F) of the trench will also have to be etched at the points where two transistors should lie opposite one another in a trench. During the following etching process, it is therefore necessary to etch holes which have significantly different cross-sections. Since the customary oxide etching processes open small holes more slowly than large ones, the lower bit line is already severely attacked in the large holes, while the small holes have not yet been correctly opened. The upper bit line is also inevitably overetched unless it can be protected by an additional covering layer. The resistance of the attacked bit lines is significantly increased. This technological limitation leads to an increase in the minimum achievable cell area and thus to a cost disadvantage.

SUMMARY OF THE INVENTION

It is accordingly an object of the invention to provide an improved ROM with a vertical transistor which overcomes the above-mentioned disadvantages of the heretofore-known ROMs of this general type and which has a self-aligning programming. It is furthermore an object of the invention to provide a method of manufacturing such a ROM.

With the foregoing and other objects in view there is provided, in accordance with the invention, a semiconductor read-only memory, comprising:

a semiconductor substrate having a main surface with a plurality of parallel trenches formed therein, each of the plurality of parallel trenches having a respective cross-sectional area and being defined by a respective base and respective side-walls opposing each other, the respective side-walls spaced apart by a trench width;

a plurality of trench crowns, each formed between a respective two of the plurality of parallel trenches;

a first plurality of bit lines, each formed in a respective one of the plurality of parallel trenches on the base;

a second plurality of bit lines, each formed on a respective one of the plurality of trench crowns;

a plurality of a word lines extending perpendicular to the first plurality of bit lines and the second plurality of bit lines;

a first, a second, and a third transistor formed in respective regions of the side-walls in a direction vertical or perpendicular to the main surface, the first and the second transistors formed on opposing sides of the side-walls and facing each other; and an insulator filling provided in the plurality of parallel trenches, the respective cross-sectional area of each of the plurality of parallel trenches being free of the insulator filling across the trench width at the respective regions of the side walls.

In accordance with another feature of the invention, the trench width has the same value for each of the plurality of parallel trenches and the respective regions being free of the insulator filling having identical dimensions.

In accordance with a further feature of the invention, selected channel regions are provided. The selected channel regions are selected in accordance with programming requirements and have a changed doping such that a conductivity characteristic of the selected channel regions is changed.

In accordance with another feature of the invention, the selected channel regions have an additional doping.

In accordance with yet another feature of the invention, gate structures are filled in the plurality of trenches at the respective regions being free of the insulator filling.

In accordance with a further feature of the invention, the gate structures each have a gate oxide and a gate stack.

With the objects of the invention in view there is also provided a method of manufacturing a semiconductor read-only memory, the method which comprises:

providing a semiconductor substrate having a main surface;

forming parallel trenches in the main surface of the semiconductor substrate, the trenches being defined by bases and side-walls, the side-walls being spaced apart by a trench width;

filling the trenches with an insulator;

etching the insulator for forming holes in the insulator at regions where word lines and decoder lines are to run over the trenches, the holes being as wide as the trench width;

providing transistors having channel regions in the side walls;

selecting the transistors corresponding to programming requirements;

changing the conductivity characteristics of the channel regions of the selected transistors by using a mask process and by doping; and forming gate structures on the channel regions.

In accordance with another mode of the invention, the doping is carried out as an oblique doping implantation.

In accordance with a further mode of the invention, the mask process is carried out with a resist mask.

The invention combines specific features of the two programming methods above in a way that results in unexpected advantages.

A ROM which is programmed in a self-aligning fashion is obtained with a ROM with parallel trenches, bit lines running on the trench bases and the trench crowns in a longitudinal direction of the trenches, word lines running transversely thereto and transistors running vertically in the trench side-walls by filling the trenches with insulator, the insulator being removed over the entire cross-section of the trenches in the trench areas having a transistor on one of the trench side-walls and having transistors on both trench side-walls. Since the insulator is removed in the respective trench areas over the entire trench cross-section, no difficulties arise during the process of manufacturing the insulator-free regions using an etching method owing to extreme deviations in the cross-section of the insulator-free regions. The insulator-free regions are produced uniformly during the etching, and etching into the bit lines is minimized.

In a ROM according to the invention, all the trenches are advantageously of equal width and all the insulator-free regions in the trenches are of equal size. As a result, these regions can be manufactured very precisely using an etching method and possible damage to the bit lines can largely be avoided.

In accordance with an advantageous embodiment, the conductivity of the channel regions of the transistors selected by the programming request is changed by an oblique doping implantation. The doping ions are then incident obliquely from above on the trench side-walls to be implanted in the intended regions, while the regions which are not provided for implantation are masked or screened by a mask.

Good results are obtained if a resist mask is used to screen the trench side-walls from the implantation.

The insulator-free regions of the trenches are suitably filled with a gate structure. Since the trench side-walls of these regions are used as channels containing the programming information, in accordance with this embodiment the transistors can be positioned in the insulator-free trench regions.

A gate stack can advantageously be provided in the insulator-free regions which are constructed uniformly with a high degree of precision through the use of the ROM design according to the invention.

In accordance with the invention, in order to manufacture a ROM with parallel trenches, with bit lines running on the trench bases and the trench crowns in the longitudinal direction of the trenches, with word lines running transversely thereto and transistors extending vertically in the trench side-walls, a method having the following steps is applied:

The trenches are filled with the insulator. At the regions where word lines and decoder lines will run over the trenches later, holes, which are as wide as the trench, are etched into the insulator. The conductivity characteristic of the channel regions of transistors selected according to programming requirements are changed using a mask method. Gate structures are applied on the channel regions.

The manufacturing method according to the invention ensures that the bit lines are largely spared and that programming is self-aligning. The insulator-free regions can be manufactured easily, since the problem of the holes, which are to be etched into the insulator, having cross-sections which differ greatly from one another does not occur. The insulator-free regions are thus formed very uniformly by etching. This avoids a situation in which overetching already occurs in relatively large regions to be etched, and surrounding regions, for example the bit lines, are etched into, while relatively small regions to be etched are not yet completely etched. As a result of the insulator fillings remaining after the manufacture of the insulator-free trench regions in the trench, the trench region which lies below these insulator fillings is effectively protected from being influenced by the subsequent mask process. A change in the conductivity characteristic of these trench side-wall regions is avoided.

Other features which are considered as characteristic for the invention are set forth in the appended claims.

Although the invention is illustrated and described herein as embodied in semiconductor read-only memory and method of manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a perspective view of a part of a ROM structure according to the invention during the manufacturing process in a state after the insulator-free regions in the trenches have been etched and before the mask process is performed;

FIG. 2 is a partial cross-sectional view of a ROM structure illustrating the oblique doping implantation of the trench side-walls.

DESCRIPTION OF THE PREFERRED EMBODIMENTS

Figure 3:
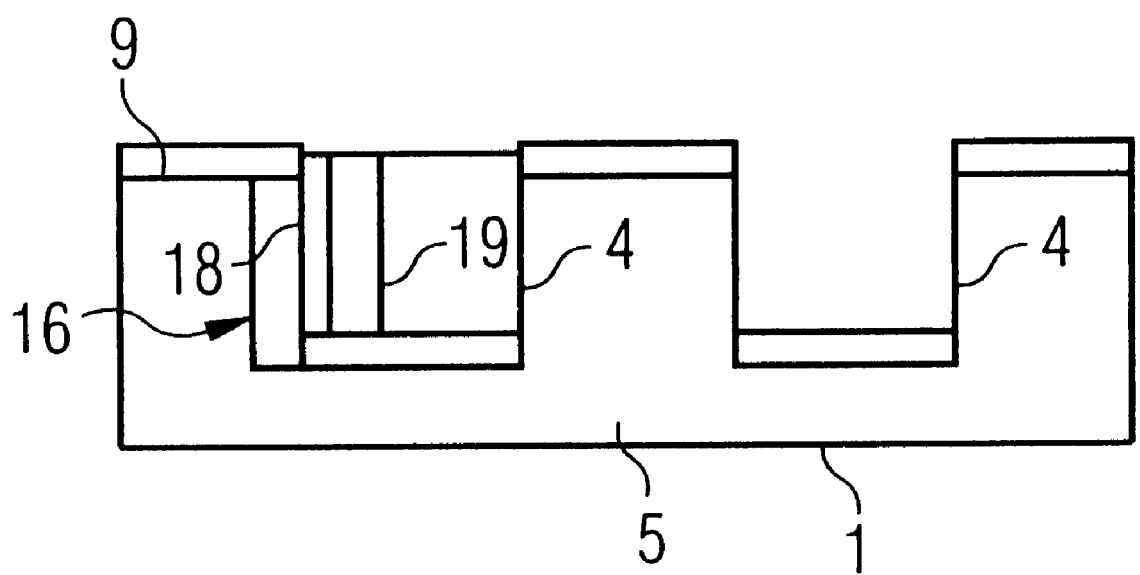
FIG. 3 is a partial cross-sectional view of a ROM structure with a vertical transistor.

Referring now to the figures of the drawings in detail and first, particularly, to FIG. 1 thereof, there is shown a semiconductor read-only memory (ROM) is formed on a silicon substrate 1. A plurality of linear trenches 2 run parallel to one another in one direction. The trenches 2 have an approximately rectangular cross-section. The base 3 can be, for example, approximately as wide as the height of the side walls 4. However, of course, other dimensions are also possible. Ridges between the trenches 2 also have a rectangular cross-section. Here, the width of the crowns 6 is approximately equal to the width of the trenches 2. The bit lines 8 and 9 run in the trench direction 7. The lower bit line 8 runs on the trench base 3 and takes up the entire width of the trench 2. The upper bit lines 9 run on the crowns 6 and also take up the entire width of the crowns 6. The bit lines 8 and 9 are formed, for example, by diffusion. They can be applied, for example, at a level of approximately one-quarter of the height of the trench side-walls 4. However, other geometric dimensions are also possible.

The word lines 15, schematically illustrated by a dashed line, run in the transverse direction 10. In the finished ROM, the word lines 15 are provided above the upper bit line 9. They cross the trenches 2 and the ridges 5 in the word line regions 11. In the trenches 2 there is an insulator filling 12. In a manufacturing stage of the ROMs before the manufacturing stage illustrated in FIG. 1, the trenches 2 were completely filled with the insulator filling 12 up to the upper edge of the upper bit lines 9. Then, in order to achieve the state of the ROM as illustrated in FIG. 1, the insulator fillings 12 were removed in the region where the word lines 15 and the trenches 2 overlap with an etching process. This etching process provides parallel piped-shaped holes in the surface of the ROM, which holes extend down as far as the lower bit lines 8 and are as wide as the trenches 2. These holes are accordingly bounded at the base by the lower bit lines 8, by the trench side-walls 4 at two sides lying opposite one another and by the insulator fillings 12 at the two other side walls lying opposite one another.

The manufacturing step following the intermediate manufacturing stage illustrated in FIG. 1 is illustrated in FIG. 2. FIG. 2 shows the programming implantation of the selected trench side-walls 4. This is a mask method in which individual trench side-walls 4 are masked or screened from the implantation by a resist mask 13 applied over them. The resist mask 13 was manufactured using a customary photochemical process. Implantation of the trench side-walls 4 with doping ions is performed from obliquely above, as is indicated by the implantation direction 14 in FIG. 2. The doping ions change the characteristic curve of the transistors 20 and 22–23 whose channel runs in the trench side-wall 4 subjected to the implantation. The source and drain of the transistors 20 and 22–23 are formed by the lower bit line 8 and the upper bit line 9. The gate insulation is applied to the trench side-wall 4 in a manufacturing step following the implantation process. Firstly a gate oxide 18, and then a gate electrode or a gate stack 19, are applied. The transistors 20 and 22–23 accordingly run in the vertical direction. Before the gates are manufactured, the resist mask 13 was removed again. Transistors with different characteristic curves are thus produced as a function of whether the trench side-wall 4 forming the channel of the respective transistor was subjected to the implantation. The different switching states of the transistors which are possible with a given operating voltage owing to the different characteristic curves form the programming information of the ROM.

FIG. 3 schematically illustrates the vertical transistor 16 with a gate oxide 18 and a gate stack 19.

After the gates have been manufactured, they are electrically connected to the word lines running in the transverse direction 10 over the upper bit lines 9.

I claim:

1. A semiconductor read-only memory, comprising:
   a semiconductor substrate having a main surface with a plurality of parallel trenches formed therein, each of said trenches having a respective cross-sectional area and defined by a respective base and respective side-walls opposing each other, said respective side-walls spaced apart by a trench width;
   a plurality of trench crowns, each formed between a respective two of said plurality of parallel trenches;
   a first plurality of bit lines, each formed in a respective one of said plurality of parallel trenches on said base;
   a second plurality of bit lines, each formed on a respective one of said plurality of trench crowns;
   a plurality of word lines extending perpendicular to said first plurality of bit lines and said second plurality of bit lines;

a first transistor, a second transistor, and a third transistor formed in respective regions of said side-walls in a direction perpendicular to said main surface, said first transistor and said second transistor of said transistors being formed on opposing sides of said side-walls and facing each other; and an insulator filling provided in said plurality of parallel trenches, said parallel trenches being completely filled with said insulator up to an upper edge of said second plurality of bit lines, said respective cross-sectional area of each of said plurality of parallel trenches being free of said insulator filling across said trench width at said side-walls where said plurality of word lines overlap said plurality of parallel trenches.

2. The semiconductor read-only memory according to claim 1, wherein said trench width has the same value for each of said plurality of parallel trenches and said respective regions being free of said insulator filling having identical dimensions.

3. The semiconductor read-only memory according to claim 1, including selected channel regions, said selected channel regions selected in accordance with programming requirements and having a changed doping such that a conductivity characteristic of said selected channel regions is changed.

4. The semiconductor read-only memory according to claim 3, wherein said selected channel regions have an additional doping.

5. The semiconductor read-only memory according to claim 1, including gate structures filled in said plurality of trenches at said respective regions being free of said insulator filling.

6. The semiconductor read-only memory according to claim 5, wherein said gate structures each have a gate oxide and a gate stack.

* * * * *